(12) United States Patent
Tester

(10) Patent No.: US 6,922,823 B2  
(45) Date of Patent: Jul. 26, 2005

(54) METHOD FOR CREATING DERIVATIVE INTEGRATED CIRCUIT LAYOUTS FOR RELATED PRODUCTS

(75) Inventor: David P. Tester, Preston (GB)

(73) Assignee: LSI Logic Corporation, Milpitas, CA (US)

( * ) Notice: Subject to any disclaimer, the term of this patent is extended or adjusted under 35 U.S.C. 154(b) by 72 days.

(21) Appl. No.: 10/318,639

(22) Filed: Dec. 13, 2002

(65) Prior Publication Data

US 2004/0117748 A1 Jun. 17, 2004

(51) Int. Cl.$^7$ ............................................... G06F 17/50
(52) U.S. Cl. .................. 716/10; 716/1; 716/2; 716/19
(58) Field of Search ........................ 716/1, 2, 10, 19, 716/11, 18; 345/98, 763

(56) References Cited

U.S. PATENT DOCUMENTS

| 6,370,679 B1 | 4/2002 | Chang et al. ................ 716/19 |
| 6,453,454 B1 * | 9/2002 | Lee et al. ..................... 716/11 |
| 2003/0184585 A1 * | 10/2003 | Lin et al. ..................... 345/763 |
| 2004/0066363 A1 * | 4/2004 | Yamano et al. ............... 345/98 |

* cited by examiner

Primary Examiner—Thuan Do  
(74) Attorney, Agent, or Firm—Christopher P. Maiorana, P.C.

(57) ABSTRACT

A method for creating a derivative semiconductor design layout is disclosed. The method generally comprises the steps of (A) receiving a plurality of changes from a user for a first layout of a semiconductor design having a plurality of first layers, (B) storing the changes in a plurality of second layers and (C) displaying the derivative semiconductor design layout to the user in response to logically operating on the first layers and the second layers.

20 Claims, 5 Drawing Sheets

METHOD FOR CREATING DERIVATIVE INTEGRATED CIRCUIT LAYOUTS FOR RELATED PRODUCTS

FIELD OF THE INVENTION

The present invention relates to integrated circuit designing generally and, more particularly, to a method for creating derivative integrated circuit layouts for related products.

BACKGROUND OF THE INVENTION

Semiconductor companies developing standard products usually end up developing families of integrated circuits (IC) to address a specific market or closely connected markets. Individual members among the family of devices are often substantially similar with certain specific modifications. The variations within the family presents a challenge for the engineering teams developing the products. The engineering teams need to develop several devices in parallel yet ensure that design modifications affecting the common aspects of the devices are implemented in all devices in the product family.

Companies that develop application specific integrated circuits (ASICs) also face a similar problem. With ASIC devices, the problem manifests itself not at the device level but at the macro level. The common elements are often analog macros such as digital to analog converters (DACs), phase locked loops (PLLs) or even standard cell logic gates. As such, the "family" of products is a "family" of macros. Since a close relationship still exists between the various designs, changes in common aspects of the designs need to be implemented in all members of the product family. Two specific challenges are presented to the IC design team, (i) tracking the similarity between devices in the product family and (ii) ensuring changes to the common aspects of the product family are implemented in all products If the devices in the product family are developed either by separate teams or groups, or the developments are performed sequentially in time, keeping track of all the various changes that need to be implemented in several devices becomes either a communication challenge and/or a schedule issue. In essence, the problem is one of managing the content and complexity of the design databases for several closely related IC developments. Support within appropriate electronic design automation (EDA) software used to design the ICs is also important.

An industry practice is at best to recognize the problem as an issue. Typically, each development team depends on a particular individual, usually the team manager, to track common aspects of devices in a product family or devices or macros. The particular individual approach is an ad-hoc process for controlling the development challenge. The individual needs to be aware of all the concurrent developments, making the person less efficient as an IC designer since more time is spent in meetings and less time designing. Therefore, the process is both inefficient and does not capture the design information in a controlled way. If the particular individual is no longer part of the team, information is lost and the tracking mechanism fails. Development will continue but productivity falls since work is repeated on several related devices when the work could have been performed just once.

Referring to FIG. 1, a flow diagram of a conventional method for developing a device is shown. The method begins when a plan to create a new macro or device layout is identified (i.e., block 20). If no similar existing design is available (i.e., the NO branch of decision block 22), a new layout database is generated from scratch (i.e., block 24). If a similar design already exists (i.e., the YES branch of decision block 22), a copy of the existing database may be modified to achieve the planned design (i.e., block 26).

An initial layout of the derivative product is then generated from the new or modified database (i.e., block 28). The initial layout is subjected to manual review (i.e., block 30) and physical verification (i.e., block 32). After any detected errors are corrected, the layout is ready to release (i.e., block 34). A copy of the layout database is archived for future use (i.e., block 36) and a Graphic Design System II (GDSII) layout file is streamed out for release to a foundry (i.e., block 38).

Conventional development of a derivative product in existing design flows used in industry practice can, but does not always, feed the changes made to the existing product back into the database for the baseline product. Further derivative products follow an iterative process and thus each subsequent product has an increasing number of baselines available to choose from as a starting point. A set of complex, related layout databases is thus formed. However, the relationships between each product are not captured in a rigorous fashion.

SUMMARY OF THE INVENTION

The present invention concerns a method for creating a derivative semiconductor design layout. The method generally comprises the steps of (A) receiving a plurality of changes from a user for a first layout of a semiconductor design having a plurality of first layers, (B) storing the changes in a plurality of second layers and (C) displaying the derivative semiconductor design layout to the user in response to logically operating on the first layers and the second layers.

The objects, features and advantages of the present invention include providing a method for creating derivative integrated circuit layouts for related products that may: (i) improve an efficiency of the layout process when several related layouts are developed in parallel, (ii) identify common layout design information and flag the information as common, (iii) provide a single point of reference for common information, (iv) improve time to market for IC development since the same changes don't need to be implemented several times in several products, (v) remove communication between design teams as a limiting factor in efficiency, and/or (vi) avoid costly iterations of designs because changes are not replicated, potentially over several products, either in duplicate instances of a macro or related devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally addresses a management of design data associated with layouts of several closely related integrated circuits (ICs) or semiconductor designs in a product family. The present invention may be equally applicable to management of design data associated with the layout of devices, blocks, macros and the like. For example, the macros may be used in application specific integrated circuits (ASICs), radio frequency integrated circuits (RFICs), application specific standard product (ASSPs), field programmable gate arrays (FPGAs) and similar applications.

Concurrent development of several closely related layout databases for multiple products often results in a majority of the layout databases content being identical. Rather than develop several layout databases (e.g., for several product layouts) in parallel, a common or shared layout may be employed. Each device is generally based on the common layout. Variations for each device may be captured explicitly.

Figure 1:
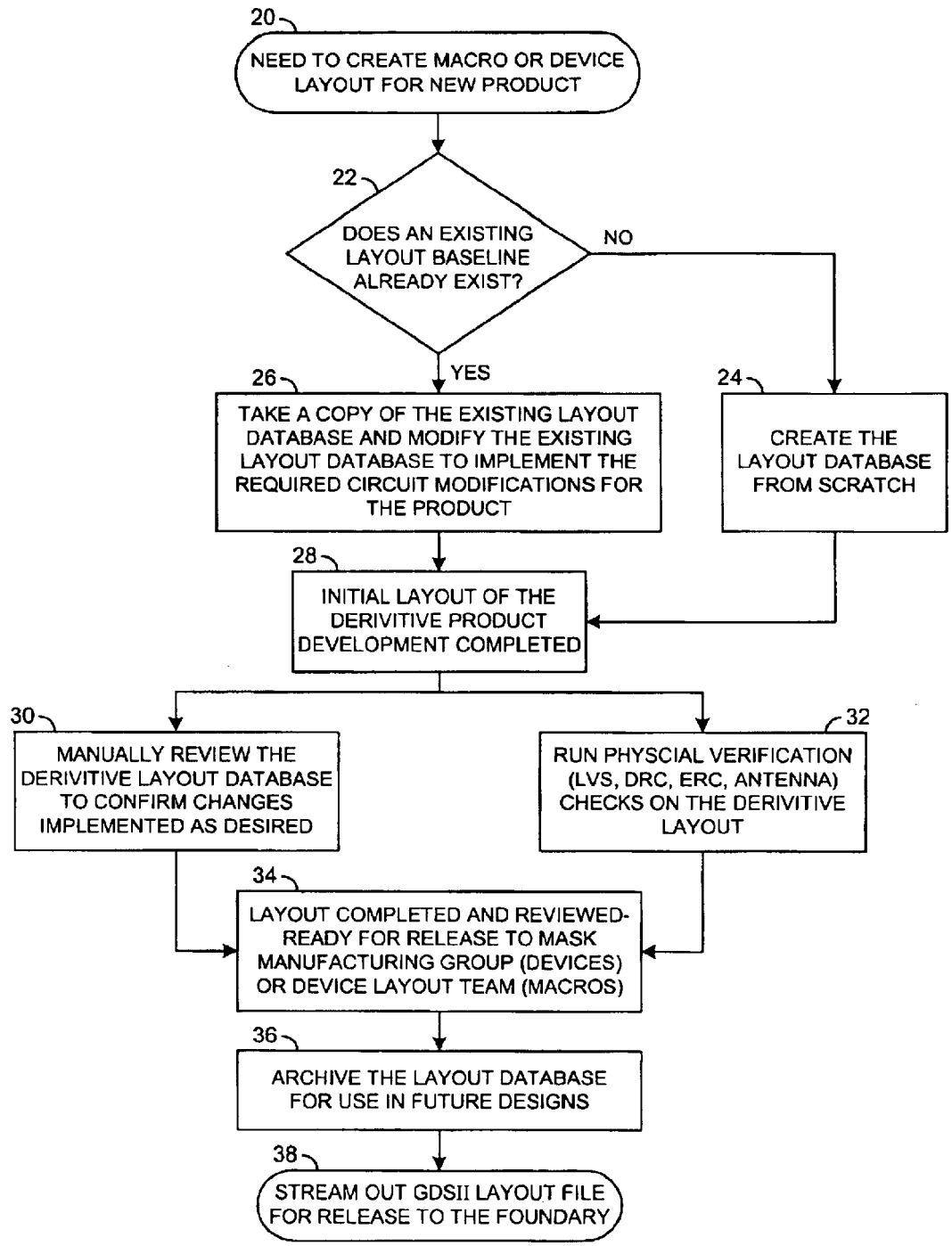
FIG. 1 is a flow diagram of a conventional method for developing a device.
Figure 2:
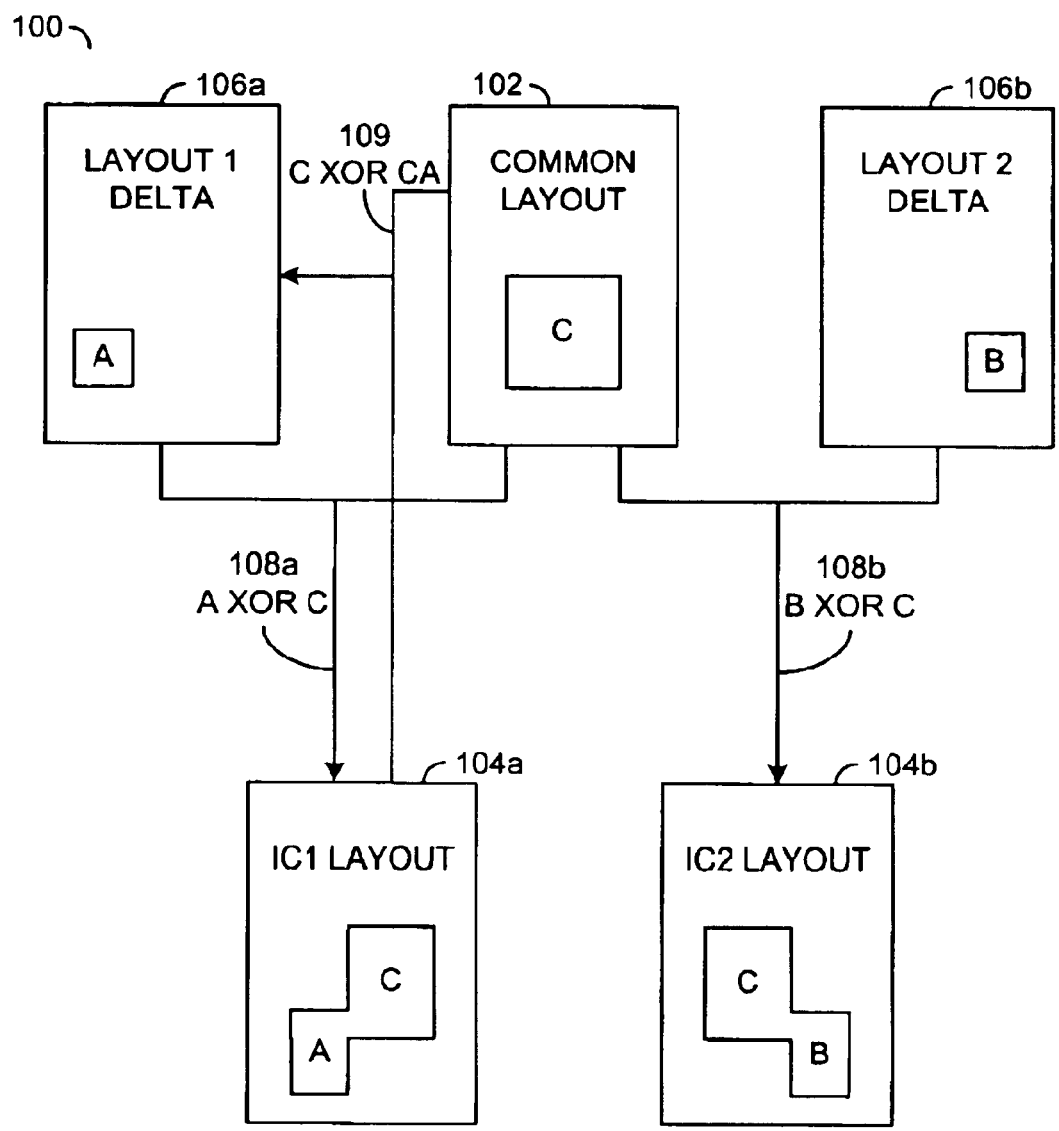
FIG. 2 is a diagram illustrating an example approach of a preferred embodiment of the present invention.

Referring to FIG. 2, a diagram illustrating an example approach 100 of a preferred embodiment of the present invention is shown. A baseline product layout 102 from which multiple products 104a–b of a product family may be identified. The baseline layout 102 may be of an existing product. The baseline layout 102 may be a previously completed development not yet released as a product. Differences between the baseline layout 102 and the individual product layouts 104a–b may be captured in separate layouts 106a–b. Each separate layout 106a–b may be considered as a layout delta or change from the baseline layout 102. The changes may define additions and/or deletions relative to the baseline layout 102.

For example, a layout region (e.g., region C) in the common layout 102 may be logically combined 108a with another layout region (e.g., region A) in the layout delta 106a to generate the first product layout 104a. The layout region C within the common layout 102 may be logically combined 108b with a layout region (e.g., B) in the layout delta 106b to generate the second product layout 104b. The combinations of the regions A with C and regions B with C may be performed as logical exclusive OR (XOR) operations. The XOR operations generally allow regions A and B to add to and delete from areas from the region C. Repeated over many changes on many layout layers (each layer associated with one or more masks in a manufacturing process), the result may be two distinct product layouts 104a–b each sharing the common layout 102. If a modification is identified for the first product layout 104a that involves the common region C, then the change may be made to the common layout 102 and both the first and the second product layouts 104a–b may be regenerated. Therefore, the change made for the sake of the first product layout 104a may also be implemented in the second product layout 104b. Iterations of multiple changes may be implemented as sequential sets of XOR layers. Therefore, a history of each change may be retained for each development.

A reverse operation to the logical combination 108a may be used to determine the delta layout 106a from the common layout 102 and the first product layout 104a. A logical XOR operation 109 may be performed between the region C and the combined region CA to calculate the region A. The region A may be identified as a difference between the region CA and the region A. The operation 109 may be used, for example, to generate initial XOR layers from a set of baseline layers and an existing set of derivative layers.

Use of the delta or XOR layout data may be expanded to all layers within the product layouts 104a–b. Each standard layer used in a layout database and eventually exported to a layout file in an existing industry standard practice flow may have an associated XOR layer defined for capturing modifications. For example, a metal layer (e.g., METAL1) used to capture polygons formed in a first layer of metal in the target production process may be augmented with an additional metal XOR layer (e.g., METAL1_XOR). The two layout layers METAL1 and METAL1_XOR may be merged with an XOR operation during preparation of a final layout for release to a foundry for manufacture. An example of a standard layout file format may be the Graphic Design System II (GDSII). Other layout file formats may be implemented to meet the criteria of a particular application.

All layers such as a well diffusion (e.g., NWELL), thin oxide region (e.g., OD), p diffusion (e.g., PDIFF), n diffusion (e.g., NDIFF), thick oxide region (e.g., OD2), polysilicon (e.g., POLY), n+ implantations (e.g., NP), p+ implantations (e.g., PP), resist protection oxide (e.g., PRO), contacts (e.g., CO), pads (e.g., PAD), electrostatic discharge implantations (e.g., EDS) native device blocked implantation (NT_N), dummy layers (e.g., DMN2V and DMP2V), metal layers (e.g., METAL1 though METAL6) and vias (e.g., VIA1 through VIA6) may be augmented with XOR layers in a similar way. A list of common layers 102 in a database may be NWELL, OD, PDIFF, NDIFF, OD2, POLY, NP, PP, RPO, CONTACT, PAD, ESD, NT_N, DMN2V, DMP2V, METALl1, VIA1, METAL2, VIA2, METAL3, VIA3, METAL4, VIA4, METAL5, VIA5, METAL6 and VIA6. A list of delta layers 106a–b in the database may be NWELL_XOR, OD_XOR, PDIFF_XOR, NDIFF_XOR, OD2_XOR, POLY_XOR, NP_XOR, PP_XOR, RPO_XOR, CONTACT_XOR, PAD_XOR, ESD_XOR, NT_N_XOR, DMN2V_XOR, DMP2V_XOR, METALl1_XOR, VIA1_XOR, METAL2_XOR, VIA2_XOR, METAL3_XOR, VIA3_XOR, METAL4_XOR, VIA4_XOR, METAL5_XOR, VIA5_XOR, METAL6_XOR and VIA6_XOR. Other layers and XOR layers may be defined for use in other fabrication processes to meet the criteria of a specific technology. A list of layers for the standard file format GDSII or similar files may remain unchanged from conventional lists since the XOR operations may be performed prior to creation of the final layout layers 104a–b.

Because differences in the layouts may be captured through an XOR process, pieces may be added and/or deleted relative to the baseline layout while the baseline layout generally remains unchanged. To add regions relative to the baseline layout, the new layout information is generally incorporated into the relevant XOR layers. To delete regions relative to the baseline layout, the relevant pieces of the existing layout may be copied into the appropriate XOR layers. The XOR process generally takes care of adding and/or deleting the relevant layout polygons and thus may be built into conventional layout software tools (e.g., electronic design automation (EDA) software).

With the XOR layer support built into the layout software tools, the list of layout layers presented to a mask designer or human user is generally identical to the list seen in conventional industry practice. From the user's point of view, editing the layers may have a conventional look and feel. The present invention may be realized within the EDA tool database and thus may be transparent to the user during layout activities. The invention generally enables further layout operations and database organization techniques with no negative implications at the user interface. Therefore, the present invention may introduce a minimal learning curve for the designers and so productivity may not be adversely affected.

Figure 3:
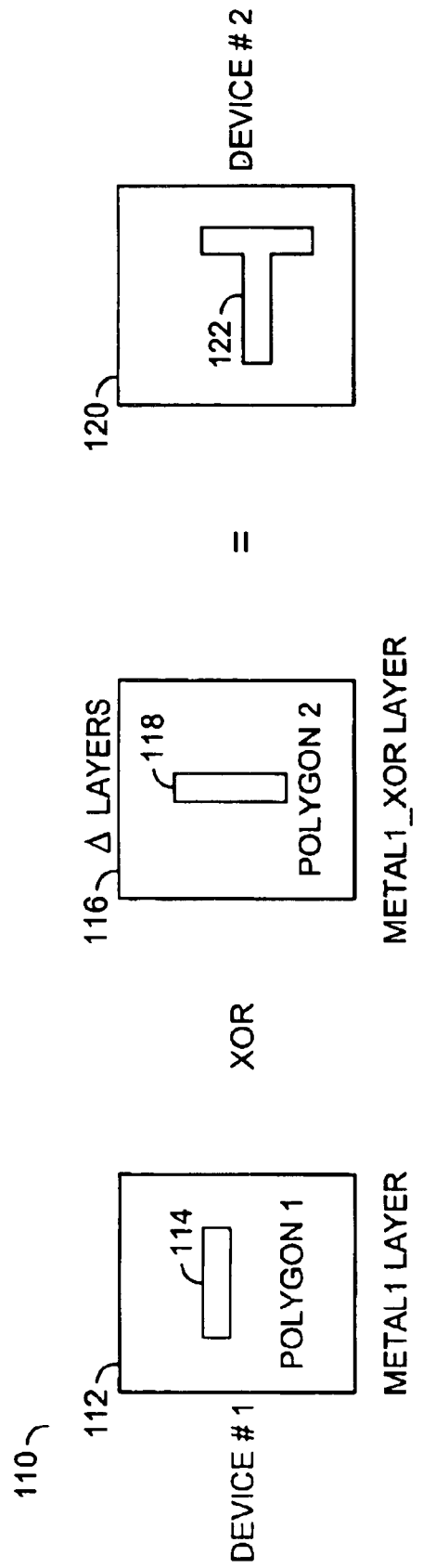
FIG. 3 is a diagram of an example approach for adding to an existing polygon.

Referring to FIG. 3, a diagram of an example approach 110 for adding to an existing polygon is shown. A layout 112 of a layer (e.g., METAL1) for a first device (e.g., Device #1) may include a polygon 114. To modify the polygon 114 for use in a second device (e.g., Device #2), a second layout 116 of a delta layer (e.g., METAL1_XOR) may be created having a second polygon 118. In the example 110, the first polygon 114 and the second polygon 118 are non-overlapping and adjoining. Therefore, upon performing an XOR function between layers 112 and 116, a resulting layer 120 for the second device may be created having a polygon 122. The polygon 122 may be a sum of the first polygon 114 and the second polygon 118.

Figure 4:
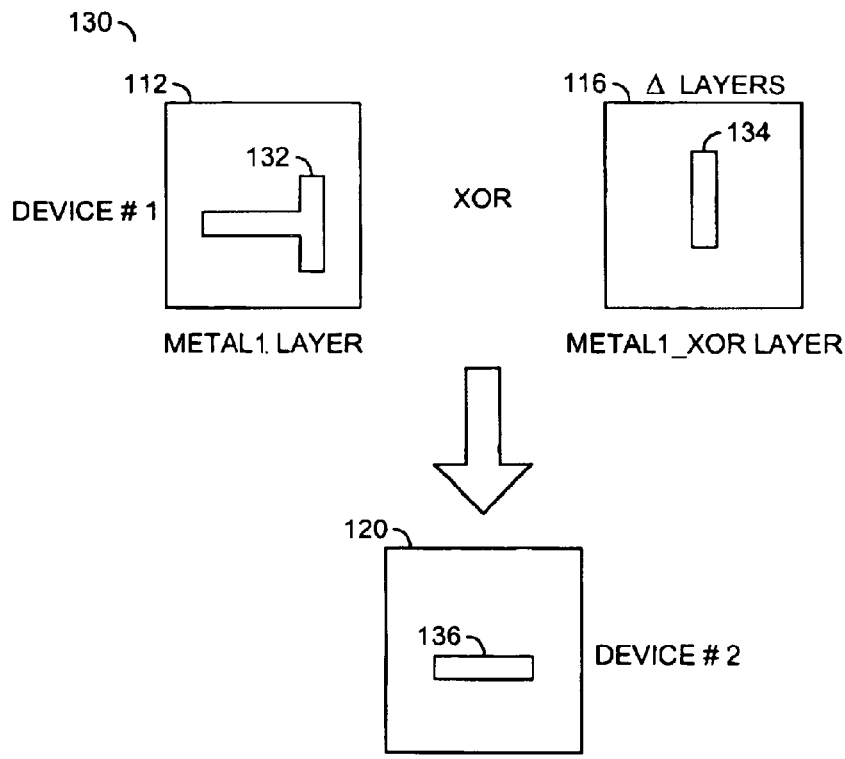
FIG. 4 is a diagram of an example approach for deleting from an existing polygon.

Referring to FIG. 4, a diagram of an example approach 130 for deleting from an existing polygon is shown. The layout 112 of the METAL 1 layer of Device #1 may include a polygon 132. The layout 116 of the METAL1_XOR layer may include another polygon 134. The polygon 134 may overlap a portion of the polygon 132. Applying the XOR function to the METAL1 layout 112 and the METAL1_XOR layout 116 generally produces the derivative layout 120 of the METAL1 for the Device #2. The resulting polygon 136 in layout 120 may comprise the area or region of the polygon 132 minus the area or region of the polygon 134.

The additional information (e.g., added and/or deleted) of the polygons in Device #2 are generally captured within a layout database defining the XOR layers. The mask designer may see the result of each layer XORed with the appropriate XOR counterpart. The changes from the Device #1 layer 112 to the Device #2 layer 120 may be captured in the XOR mask layer 116. The final layout file may be based upon the Device #2 layer 120 and therefore may implement the conventional format. From the Device #2 layer 120, there are generally no downstream implications for the enhanced methodology of the present invention. The methodology may result in layouts going through the mask design flow in a more productive way.

The present invention generally allows for concurrent development of mask layouts for several, closely related devices, products and/or macros while capturing common aspects of the family. As a result, design modifications applied to the common aspect of any particular device may be merged into all the layout databases for the related products. Another aspect of the present invention may be that the deltas between iterations of a design become absolutely obvious. The XOR layers, and not the complete layout database, may be reviewed to see the impact of the modifications. While two groups may be concurrently developing two variants of a design (e.g., a processor) from the same original design, the corrections identified by each group in the initial or reference design may be carried into the other design and vice versa.

The implications of adding the XOR layers to the list of layers used in the layout may be extensive. The XOR layer idea may be reasonably simple to extend into a full-custom environment where the layout may be completely captured in a single tool (e.g, Cadence Virtuoso available from Cadence Design Systems, Inc., San Jose, Calif.). Adding the extra XOR layers into such a tool is generally straightforward. Extending the XOR layer method into the semi-custom place-and-route flows used for standard cell logic (e.g., used in ASICs) may be somewhat more complex. The same techniques maybe applicable to the results of the place-and-route flows by treating the place-and-route as a point task or operation that creates a layout. After an initial layout has been created, engineering change order (ECO) operations may be run to modify the standard cell logic layout and capture the ECO information in the XOR layers.

The list of ECOs may be clear at a subsequent design/layout review. Changes made to the layout at the back-end of a design flow right before a product is released into production generally remain well documented in the XOR layers and thus may be fed back through the design flow into the VHDL/Verilog used to originally describe the ASIC.

In a situation where a family of devices already exist, a reverse of the XOR operation may be performed to identify the XOR layers. For example, a single device of the family may be identified as the baseline reference and then post-processing may be performed on the other family members to generate the XOR layouts for each mask layer. Design information for the other family members which was thought lost may consequently be recovered.

The post-processing stages may easily be implemented in a layout tool that interfaces to all existing layout software through compatible layout database interfaces and file formats. Since the focus shifts from the entire layout to the deltas between layouts, physical verification of the delta layouts generally becomes easier since verification may be limited to the changes rather than re-verifying everything.

By way of example, consider a digital to analog converter (DAC) macro. A current steering type DAC is generally a collection of current mirrors with associated support logic. Layout of the DAC macro may comprise a huge, complex array optimized for area. A second DAC macro may be created by altering a size of a basic current mirror of the first DAC macro. Since the first DAC macro layout may be hierarchical, the changes may take place in a single cell that may be replicated. As such, the overall layouts of the first DAC macro and the second DAC macro may remain basically similar yet have slight differences. The method in the present invention would allow both DAC designs to be captured in the same layout database.

Figure 5:
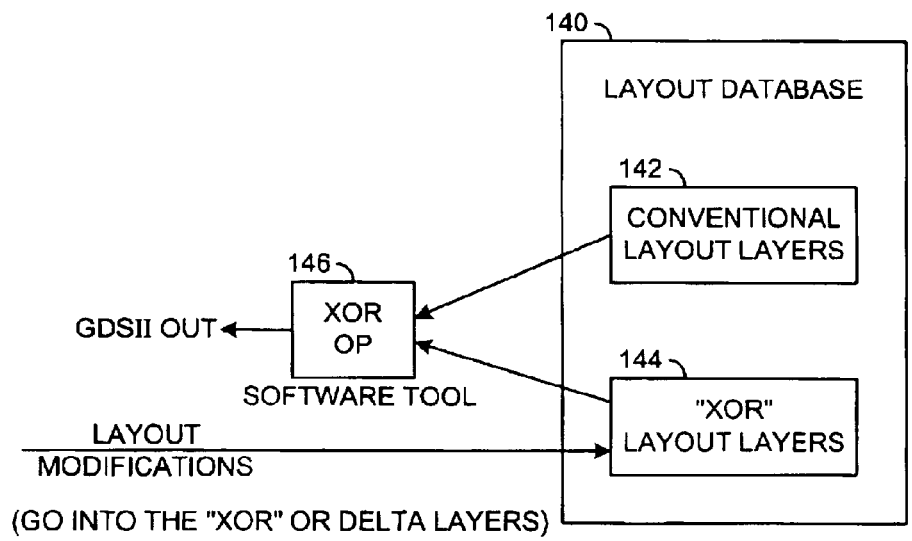
FIG. 5 is a block diagram of an example layout database.

Referring to FIG. 5, a block diagram of an example layout database 140 is shown. The database 140 generally comprises the conventional layout layers 142 and the XOR layout layers 144. Modifications to the database 140 to correct errors and/or generate derivative devices may be implemented exclusively in the XOR layout layers 144. Generation of a GDSII or similar file may be preceded by the XOR operation 146 that combines the normal and XOR layout layers 142 and 144.

Figure 6:
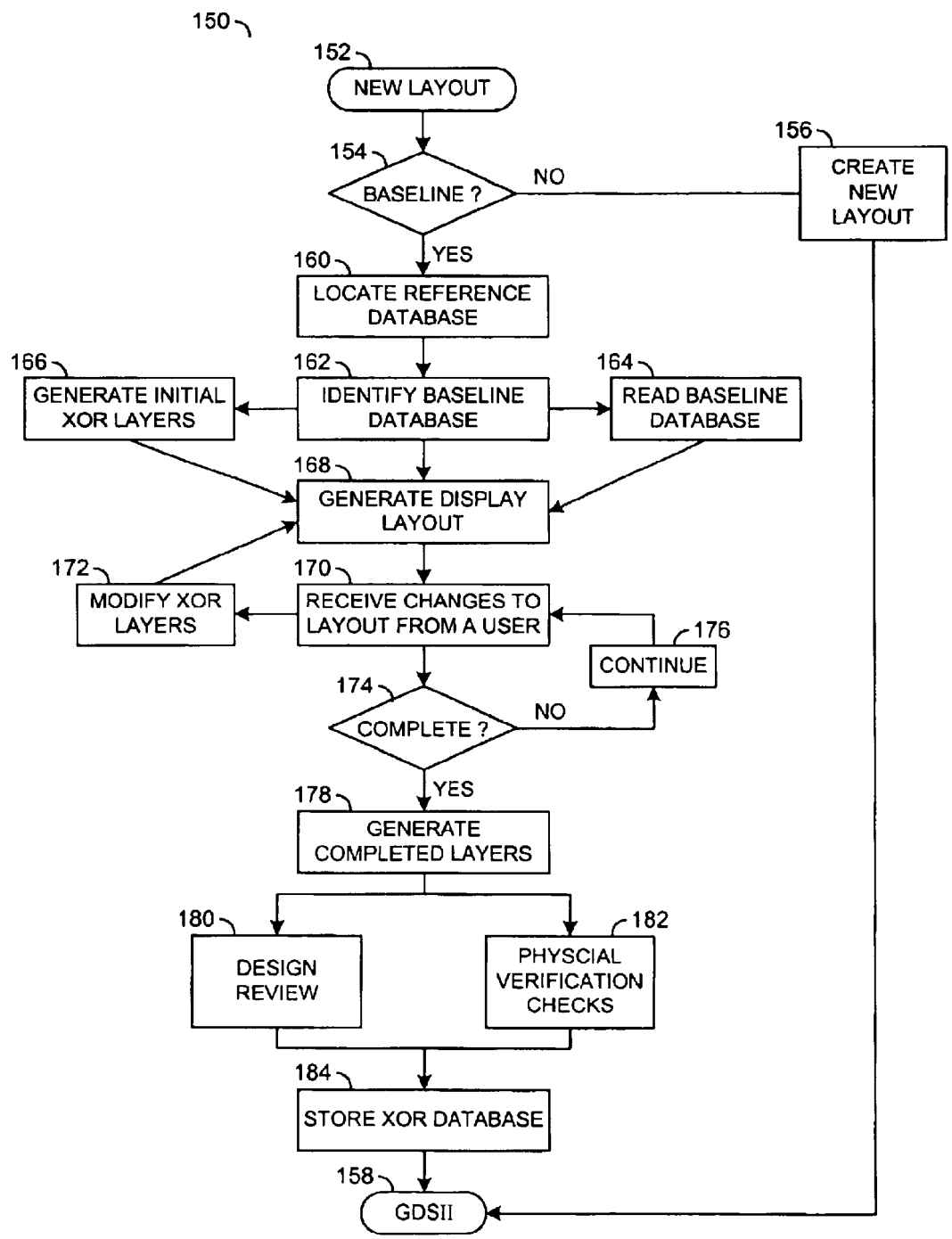
FIG. 6 is a detailed flow diagram of an example process for generating a design.

Referring to FIG. 6, a detailed flow diagram of an example process 150 for generating a design is shown. The process 150 may be implemented as a system generally comprises one or more software tools (e.g., 146) operating on a database (e.g., 140). The system process 150 generally begins upon identifying a new design or layout project (e.g., block 152). If a baseline design does not exist (e.g., the NO branch of decision block 154), a new layout database may be generated from scratch. The new database may become the baseline for any future design changes. The new design may then be developed using a conventional process (e.g., block 156). The completed database may then be changed to a standard layout file for release to a foundry (e.g., block 158).

If a baseline database does exist (e.g., the YES branch of decision block 154), a reference database for the product family may be located (e.g., block 160). The reference database may or may not be a baseline layout. For example, the reference database may be an iteration of an original design. The baseline for a product iteration may itself be derived from a previous baseline incorporating previously implemented delta modifications. A true baseline database may be identified from the reference database (e.g., block 162). The true baseline database may provide an initial frame of reference for all modifications used to establish the new design.

The baseline database may be read (e.g., block 164) into a software tool (e.g., a layout tool). Where a design has passed through several iterations, the reference database or some earlier database may be deemed suitable to mark or reclassify as a new baseline database. The XOR layers may thus be initially generated as a null set of layers. In any case, the original or newly marked baseline database generally becomes the foundation of the new design.

Where a baseline database (e.g., original or new) and a subsequent reference database exist, an initial set of XOR layers may be generated (e.g., block 166) to capture changes between the baseline and the reference. In one embodiment, the resulting initial set of XOR layers may contain a history of previous iterations as a sequential series of delta changes. The sequence may contain multiple sets of XOR layers each applied one after another. In another embodiment, the resulting initial XOR layers may contain a single cumulative delta that merges all of the individual delta changes from the baseline to the reference.

If the baseline database and the reference database are identical, an initial set of blank XOR layers may be generated. The XOR layers may be used to capture all prior and all future changes from the baseline layout. A physical design engineer generally does not directly manipulate the XOR portion to the database since the XOR layers may be hidden from the engineer. The software tool may present multiple layout layers to the physical design engineers as a virtual single layout layer.

The software tool may combine the baseline database and the XOR layers to generate a displayable layout (e.g., block 168). The software tool may generate the displayed layout layers by performing the XOR operation between the baseline layers and the associated XOR layers. The physical design engineers thereafter may make change decisions based upon the displayed layout layers.

The software tool may receive changes and modifications from the physical design engineers to convert the reference database to the new database for the new design (e.g., block 170). Each delta or change may be directed to one or more layers in a displayed layout layer list (e.g., NWELL, OD, PDIFF, NDIFF, OD2, POLY, NP, PP, RPO, CONTACT, PAD, ESD, NT_N, DMN2V, DMP2V, METAL1, VIA1, METAL2, VIA2, METAL3, VIA3, METAL4, VIA4, METAL5, VIA5, METAL6 and VIA6). However, the software tool may implement the changes by modifying only the XOR layers in the database (e.g., block 172). The modified XOR layers may then be fed back to update the displayed layers (e.g., block 168). Therefore, all changes made by the physical design engineers may be captured in the XOR layers. For example, a change may involve widening an existing metal trace through a change to the METAL3_XOR layer. The software tool may leave the existing METAL3 layer polygon in the baseline database alone and simply add an adjoining polygon to the METAL3_XOR layer in the layout layer list. To the design engineer, a combination of the adjoining polygons causes the metal trace to appear wider as entered.

If modifications to generate the new design have not been completed (e.g., the NO branch of decision block 174), the process 150 may continue to allow the design engineers to make changes (e.g., block 176 and 170). Once all modifications have been completed (e.g., the YES branch of decision block 174), a completed layout for each layer in a layout layer list may be generated (e.g., block 178). The completed layout layer list may be viewed by the design engineers as a layout database comprising the "standard" list of layers reflecting the actual list of layers utilized by a foundry in a standard layout file. However, the database may arranged internally as an ordered set of polygons, over multiple layers. The layers displayed to the engineers may be generated on-the-fly by the software tool by applying the XOR operation to the baseline layout layer list.

The completed layout layers and/or the delta XOR layout layers may be reviewed and/or checked manually and/or automatically. A design review may be performed once the new design is available (e.g., block 180). The design review may be performed from one or more views. For example, the design review may consider the completed layout layers to determine the correctness of the new design. Another view may consider only the XOR layout layers to determine if the variations from the baseline design may be satisfactory. Considering just the XOR layout layers may be particularly suitable when identifying and examining changes between a current design and a new design for successful fixes to one or more problems. Problems uncovered by the design reviews may cause the process 150 to iterate back to changing the layout (e.g., block 170)

Changes between multiple iterations of layout designs (e.g., a second design and a third design generated simultaneously or sequentially) from the baseline design may also be compared. Since the XOR layout layers of the second design capture the variations from the baseline design and the XOR layout layers of the third design also capture variations from the same baseline design, performing another XOR operations between the second design XOR layout layers and the third design XOR layout layers generally identifies similarities and differences between the second design and the third design, as opposed to the differences relative to the baseline design.

One or more physical verification checks may also be performed on the completed layout layers of the new design (e.g., block 182). The physical verification checks may include, but are not limited to, layout versus schematic (LVS) checks, design rule checks (DRC), electrical rule checks (ERC) and/or antenna rule checks. Some of the checks may optionally be performed on the XOR layout layers.

Certain optimizations may also be made to reduce physical verification time. Since the layout database generally makes changes between the original design (presumed to be a physical verification "clean" design) and the new design, the software tools (e.g., a physical verification software tool that looks for DRC, ERC and/or antenna violations) need only examine the locality where changes have been made. For a complex product design, checking in only some but not all areas generally makes the physical verification process significantly more efficient. If any problems are discovered by the physical verification checks, the process 150 may iterate back to changing the layout (e.g., block 170).

Upon satisfactory completion of the design review and physical verification checks, the XOR layers in the database may be stored for future reference (e.g., block 184). The storing generally indicates that layout activity for the iteration of the reference/baseline design may be completed. A combination of the XOR layers and the baseline layers may then be streamed out as a layout file for release to a foundry for manufacture (e.g., block 158).

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, ASSPs, RFICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. A method for creating a derivative semiconductor design layout, comprising the steps of:
   (A) receiving a plurality of changes from a user for a first layout of a semiconductor design having a plurality of first layers;
   (B) storing said changes in a plurality of second layers defining at least one difference between said first layout and said derivative semiconductor design layout; and
   (C) displaying said derivative semiconductor design layout to said user in response to logically operating on said first layers and said second layers.

2. The method according to claim 1, further comprising the step of:
   storing said first layers and said second layers in a database defining said derivative semiconductor design layout.

3. The method according to claim 1, further comprising the step of:
   generating a plurality of third layers in response to combining said first layers and said second layers to establish said derivative semiconductor design layout.

4. The method according to claim 3, further comprising the step of:
   changing said third layers into a file format suitable for fabrication at a foundry.

5. The method according to claim 1, further comprising the steps of:
   generating said second layers from a plurality of third layers defining a first semiconductor design layout prior to receiving said changes.

6. The method according to claim 5, wherein generating said second layers comprises the sub-step of:
   identifying differences between said first layers and said third layers.

7. The method according to claim 5, further comprising the step of:
   reclassifying said third layers as said first layers; and
   generating said second layers as null layers.

8. The method according to claim 1, further comprising the step of:
   performing a check on said derivative semiconductor design layout in an area determined by said second layers.

9. The method according to claim 1, further comprising the step of:
   performing a check on said second layers to determine if said changes are successful.

10. The method according to claim 1, further comprising:
    a computer readable medium storing a computer program comprising the steps of claim 1.

11. A system comprising:
    a software tool configured to (i) receive a plurality of changes from a user for a first layout of a semiconductor design having a plurality of first layers and (ii) display a derivative semiconductor design layout to said user in response to logically operating on said first layers and a plurality of second layers defining at least one difference between said first layout and said derivative semiconductor design layout; and
    a database configured to store said changes in said second layers.

12. The system according to claim 11, wherein said database is further configured to store said first layers.

13. The system according to claim 11, wherein said second layers comprise an area deleted from said first layers.

14. The system according to claim 13, wherein said software tool is further configured to delete said area using an exclusive OR operation between said first layers and said second layers.

15. The system according to claim 11, wherein said software tool is further configured to modify said second layers in response to said changes.

16. The system according to claim 15, wherein said software tool is further configured to maintain said first layers unchanged in response to said changes.

17. The system according to claim 11, wherein said software tool is further configured to combine said first layers and said second layers into a file format suitable for fabrication at a foundry.

18. The system according to claim 11, wherein said software tool is further configured to perform a check on said database.

19. The system according to claim 11, wherein said software tool is further configured to generate said second layers from said first layers and a plurality of third layers of a another semiconductor design layout.

20. A system comprising:
    means for receiving a plurality of changes from a user for a first layout of a semiconductor design having a plurality of first layers;
    means for storing said changes in a plurality of second layers defining at least one difference between said first layout and a derivative semiconductor design layout; and
    means for displaying a derivative semiconductor design layout to said user in response to logically operating on said first layers and said second layers.

* * * * *